(12) United States Patent
Cherif et al.

(10) Patent No.: US 11,283,445 B1
(45) Date of Patent: Mar. 22, 2022

(54) TRAP CIRCUITS FOR USE WITH CAPACITIVELY-COUPLED RESONANT CLOCK NETWORKS

(71) Applicant: Microsoft Technology Licensing, LLC, Redmond, WA (US)

(72) Inventors: Bouchaib Cherif, Yorktown Heights, NY (US); Max Earl Nielsen, Pocatello, ID (US)

(*) Notice: Subject to any disclaimer, the term of this patent is extended or adjusted under 35 U.S.C. 154(b) by 0 days.

(21) Appl. No.: 17/194,578

(22) Filed: Mar. 8, 2021

(51) Int. Cl.
*H03K 17/92* (2006.01)
*G06F 1/10* (2006.01)

(52) U.S. Cl.
CPC ............... *H03K 17/92* (2013.01); *G06F 1/10* (2013.01)

(58) Field of Classification Search
CPC .................................. H03K 17/92; G06F 1/10
USPC ......................................................... 327/528
See application file for complete search history.

(56) References Cited

U.S. PATENT DOCUMENTS

| | | | |
|---|---|---|---|
| 9,509,490 B1* | 11/2016 | Dabral | H04L 7/0008 |
| 10,608,044 B1 | 3/2020 | Herr et al. | |
| 10,754,371 B1* | 8/2020 | Strong | H01P 7/082 |

OTHER PUBLICATIONS

Kundert, Ken, "Bypass or decouple your way to power supply noise reduction", EE Times, 2005 (Year: 2005).*

* cited by examiner

*Primary Examiner* — Tomi Skibinski
(74) *Attorney, Agent, or Firm* — Ranjeev Singh; Singh Law, PLLC

(57) ABSTRACT

Trap circuits for use with superconducting integrated circuits having capacitively-coupled resonant clock networks are described. An example superconducting integrated circuit (IC) includes a clock structure coupled: (1) to a first Josephson junction (JJ) via a first capacitor, where the first capacitor is configured to receive a clock signal via the clock structure and couple a first bias current to the first JJ, and (2) to a second JJ via a second capacitor, where the second capacitor is configured to receive a clock signal via the clock structure and couple a second bias current to the second JJ. The superconducting IC further includes a trap circuit coupled between the first capacitor and the first JJ, where the trap circuit is configured to attenuate any signals generated by a triggering of the first JJ to reduce crosstalk between the first JJ and the second JJ.

20 Claims, 8 Drawing Sheets

TRAP CIRCUITS FOR USE WITH CAPACITIVELY-COUPLED RESONANT CLOCK NETWORKS

BACKGROUND

Semiconductor based integrated circuits used in electronic devices, such as digital processors, include digital circuits based on complimentary metal-oxide semiconductor (CMOS) technology or similar technologies. CMOS technology, however, is reaching its limits in terms of the device size. In addition, power consumption at high clock speeds by digital circuits based on the CMOS technology has increasingly become a limiting factor in high performance digital circuits and systems.

As an example, servers in a data center are increasingly consuming large amounts of power. The consumption of power is partly the result of power loss from the dissipation of energy even when the CMOS circuits are inactive. This is because even when such circuits are inactive, and are not consuming any dynamic power, they still consume power because of the need to maintain the state of CMOS transistors. In addition, because CMOS circuits are powered using DC voltage, there is a certain amount of current leakage even when the CMOS circuits are inactive. Thus, even when such circuits are not processing information, a certain amount of power is wasted not only as a result of the requirement to maintain the state of the CMOS transistors, but also as a result of the current leakage.

An alternative approach to the use of processors and related components, based on CMOS technology, is the use of superconducting logic based circuits. Such circuits may also be used in combination with CMOS technology based components.

SUMMARY

In one example, the present disclosure relates to a superconducting integrated circuit including a clock structure coupled: (1) to a first Josephson junction via a first capacitor, where the first capacitor is configured to receive a clock signal via the clock structure and couple a first bias current to the first Josephson junction, and (2) to a second Josephson junction via a second capacitor, where the second capacitor is configured to receive a clock signal via the clock structure and couple a second bias current to the second Josephson junction. The superconducting integrated circuit may further include a trap circuit coupled between the first capacitor and the first Josephson junction, where the trap circuit is configured to attenuate any signals generated by a triggering of the first Josephson junction to reduce crosstalk between the first Josephson junction and the second Josephson junction.

In another aspect, the present disclosure relates to a superconducting integrated circuit including a resonant clock network capacitively-coupled to a first Josephson junction and a second Josephson junction. The superconducting integrated circuit may further include a trap circuit coupled between the first Josephson junction and the resonant clock network, where the trap circuit is configured to attenuate any signals generated by a triggering of the first Josephson junction to reduce crosstalk between the first Josephson junction and the second Josephson junction.

In yet another aspect, the present disclosure relates to a superconducting integrated circuit including a first capacitor for coupling a first Josephson junction to a first node of a first clock line associated with the resonant clock network, where the first clock line is configured to provide a first clock signal having a first phase. The superconducting integrated circuit may further include a second capacitor for coupling a second Josephson junction to a second node of the first clock line. The superconducting integrated circuit may further include a third capacitor for coupling a third Josephson junction to a first node of a second clock line associated with the resonant clock network, where the second clock line is configured to provide a second clock signal having a second phase different from the first phase. The superconducting integrated circuit may further include a fourth capacitor for coupling a fourth Josephson junction to a second node of the second clock line. The superconducting integrated circuit may further include a first trap circuit coupled between the first capacitor and the first Josephson junction, where the first trap circuit is configured to attenuate any signals generated by a triggering of the first Josephson junction to reduce crosstalk between the first Josephson junction and the second Josephson junction. The superconducting integrated circuit may further include a second trap circuit coupled between the third capacitor and the third Josephson junction, where the second trap circuit is configured to attenuate any signals generated by a triggering of the third Josephson junction to reduce crosstalk between the third Josephson junction and the fourth Josephson junction.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
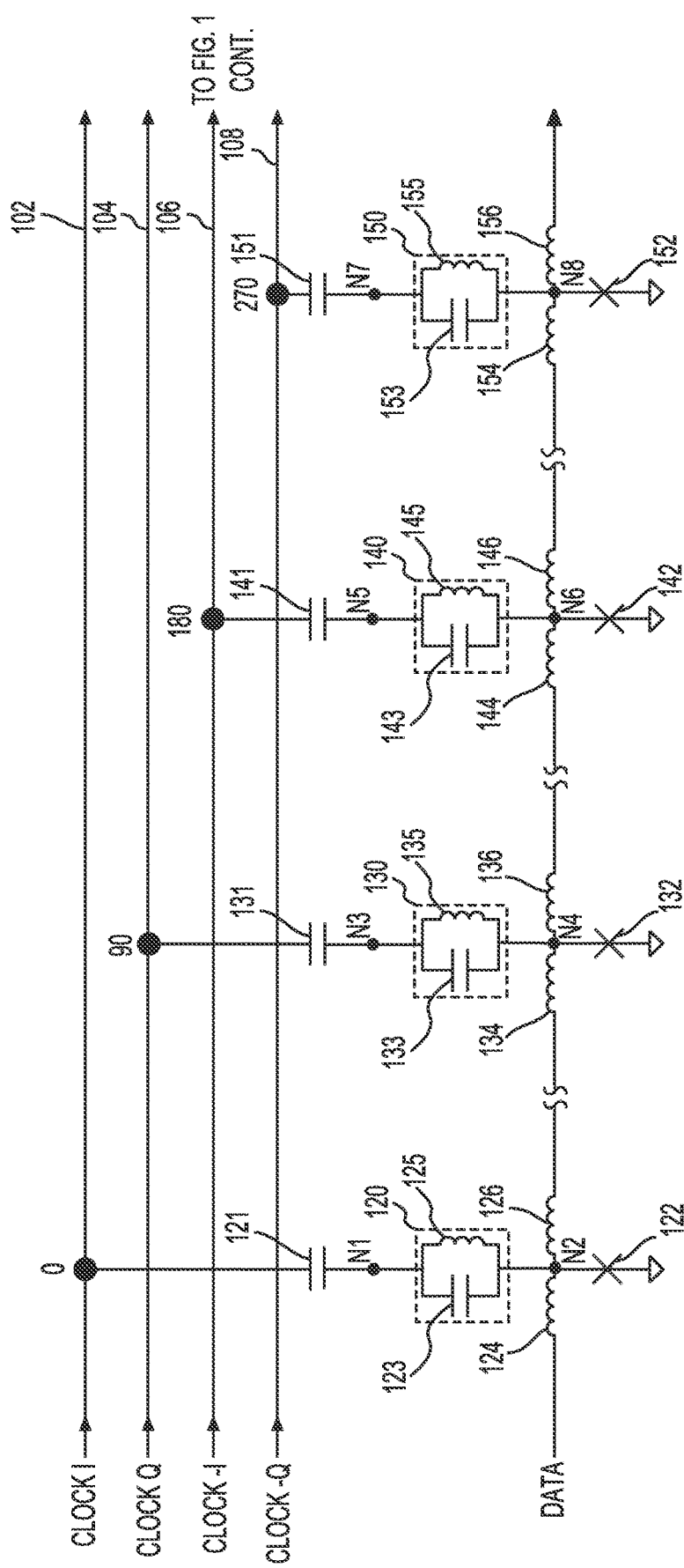
FIG. 1 is a diagram of a superconducting integrated circuit including trap circuits in accordance with one example.
Figure 1:
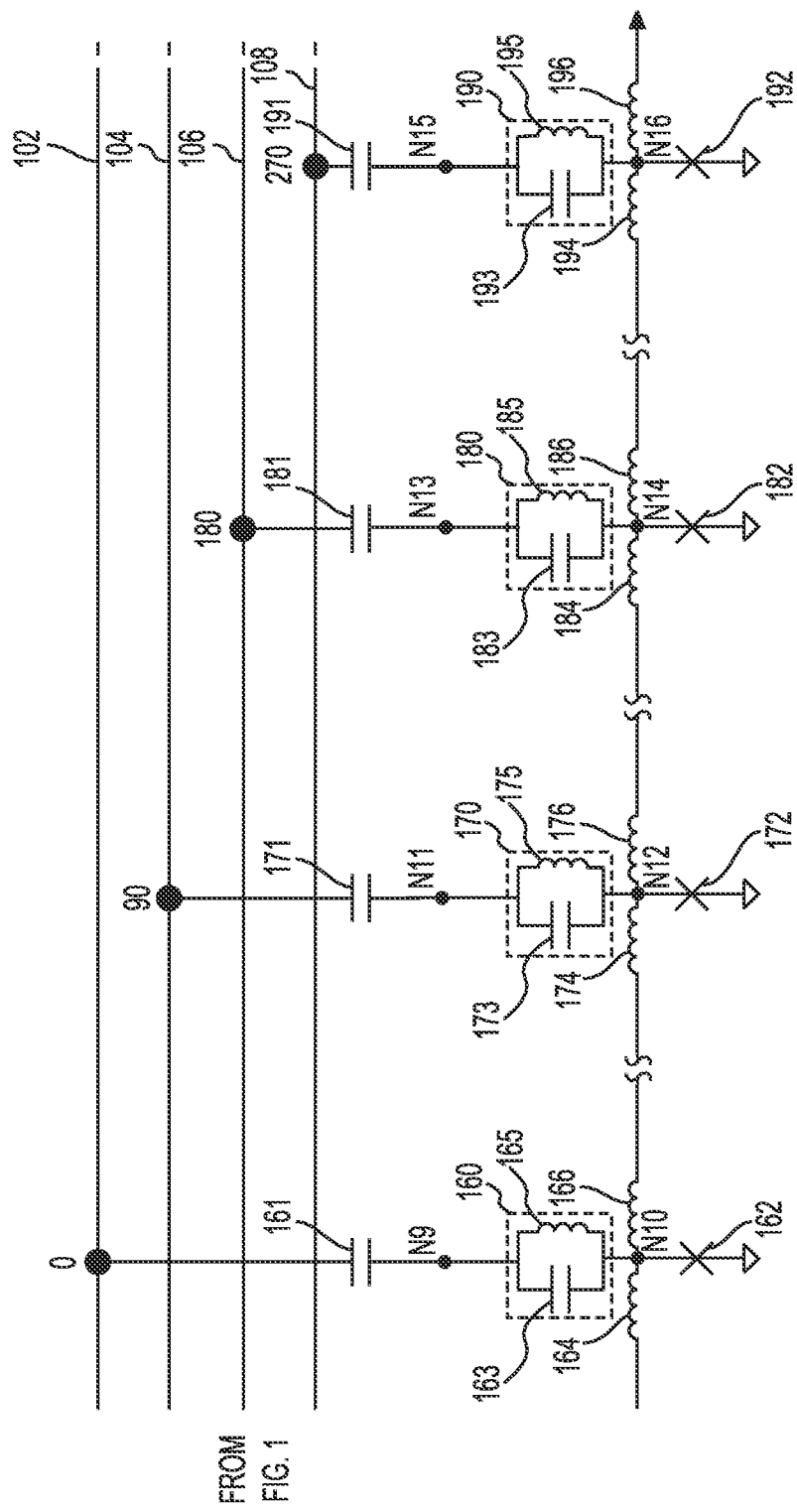

Examples described in this disclosure relate to trap circuits for use with capacitively-coupled resonant clock networks. Certain examples further relate to the use of trap circuits along with superconducting circuits that are clocked using capacitively-coupled resonant clock networks. In certain examples, the superconducting circuits may be powered using alternating current (AC). The superconducting circuits may be reciprocal quantum logic (RQL) circuits that may be implemented using wave pipelined logic. Such RQL circuits may act as low-power superconductor logic circuits. Other examples of superconducting circuits relate to rapid single flux quantum (RSFQ) circuits.

Unlike CMOS transistors, superconductor circuits use Josephson junction based devices. An exemplary Josephson junction may include two superconductors coupled via a region that impedes current. The region that impedes current may be a physical narrowing of the superconductor itself, a metal region, or a thin insulating barrier. As an example, the Superconductor-Insulator-Superconductor (SIS) type of Josephson junctions may be implemented as part of the RQL circuits. As an example, superconductors are materials that can carry a direct electrical current (DC) in the absence of an electric field. Such materials have almost zero resistance at or below their critical temperature. One example superconductor, niobium, has a critical temperature (Tc) of 9.3 Kelvin. At temperatures below Tc, niobium is superconductive; however, at temperatures above Tc, it behaves as a normal metal with electrical resistance. Thus, in the SIS type of Josephson junctions, superconductors may be niobium superconductors and insulators may be $Al_2O_3$ barriers. In SIS type of junctions, when a wave function tunnels through the barrier, a changing phase difference in time in the two superconductors creates a potential difference between the two superconductors. In RQL circuits, in one example, the SIS type of junction may be part of a superconducting loop. When the potential difference between the two superconductors is integrated with respect to time over one cycle of phase change, the magnetic flux through the loop changes by an integer multiple of a single quantum of magnetic flux. The voltage pulse associated with the single quantum of magnetic flux is referred to as a single-flux-quantum (SFQ) pulse. As an example, overdamped Josephson junctions can create individual single-flux-quantum (SFQ) pulses. In RQL circuits, each Josephson junction may be part of one or more superconducting loops. The phase difference across the junction may be modulated by the magnetic flux applied to the loop.

Various RQL circuits, including transmission lines, can be formed by coupling multiple Josephson junctions by inductors or other components, as needed. SFQ pulses can travel via these transmission lines under the control of at least one clock. The SFQ pulses can be positive or negative. As an example, when a sinusoidal bias current is supplied to a junction, then both positive and negative pulses can travel rightward, during opposite clock phases, on a transmission line. The RQL circuits may advantageously have zero static power dissipation because of the absence of bias resistors. In addition, the RQL circuits may be powered using alternating current (AC) power, thereby eliminating the ground return current. The AC power supply may also act as a stable clock reference signal for the RQL circuits. In one example, the digital data may be encoded using a pair of positive and negative (reciprocal) SFQ pulses. As an example, a logical one bit may be encoded as a reciprocal pair of SFQ pulses generated in the positive and negative phases of a sinusoidal clock. A logical zero bit may be encoded by the absence of positive/negative pulse pairs during a clock cycle. The positive SFQ pulse may arrive during the positive part of the clock, whereas the negative pulse may arrive during the negative part of the clock.

The building blocks of exemplary RQL circuits may include various types of logic gates. Exemplary logic gates include an AND gate, an OR gate, a logical A-and-not-B gate and a logical AND/OR gate. The A-and-not-B gate may have two inputs and one output. An input pulse A may propagate to the output when favorable clock conditions may be present on an output Josephson transmission line (JTL), unless an input pulse B comes first with respect to either input pulse A or the favorable clock conditions on the output JTL. The logical behavior of the gate is based on the reciprocal data encoding mentioned earlier. As an example, a positive pulse changes the internal flux state of the inductive loop, but the trailing negative pulse erases the internal state every clock cycle, which in turn produces combinational logic behavior.

Certain examples described in this disclosure relate to inserting a trap circuit between the bias capacitor of a capacitively-coupled resonant clock network (CRCN) and the Josephson junction it supplies. This trap circuit is tuned such that its parallel resonant frequency is near the frequency at which a Josephson junction rings when it triggers to generate a single flux quantum (SFQ) pulse. Thus tuned, the trap circuit presents a high impedance to the signals having frequencies associated with the SFQ pulse and the Josephson junction ringing. This high impedance greatly attenuates the interference to the Josephson junctions of nearby gates, almost eliminating the performance degradations that un-attenuated pulses cause. As used herein the term "trap circuit" incudes, but is not limited to, several examples of trap circuits described herein. In general, the term "trap circuit" includes any circuit arrangement that could be used to present a high impedance to signals generated as a result of the triggering of a Josephson junctions that could create unwanted crosstalk.

Certain examples described herein reduce the transfer of the SFQ pulses from the Josephson junctions that trigger to the Josephson junctions in nearby superconducting logic gates. Un-attenuated, this unwanted transfer of pulses negatively affects the operating margins of the superconducting logic gates. In addition, in some instances, such unwanted transfer of the pulses may introduce deterministic jitter.

Certain examples further relate to capacitively-coupled resonant clock networks (CRCN) with "capacitive feed transmission lines." Capacitors are used to couple superconducting logic gates with such transmission lines. The transmission lines are generally designed to resonate with the capacitors and the capacitive feed transmission line at the desired operating frequency. Clock sources may connect at the junctions between the resonating inductances and the capacitive feed transmission line. When a Josephson junction triggers, its energy is transferred to the circuit it connects to by means of currents flowing out of it (or in some cases flowing into it). Ideally, the current generated by the Josephson junction's triggering may flow into the inductors that connect to the Josephson junctions of the gates in the circuit it drives, and some current may flow back into the triggered Josephson junction itself or the Josephson junctions that drive the triggered Josephson junction. However, unwanted current can flow to the nearby Josephson junctions that are also capacitively coupled to the same capacitive transmission feed line. This is because the bias capacitors used for coupling are selected to have low impedance at the clock frequency of the resonant clock network. As an example, the unwanted current in the immediately adjacent Josephson junctions may be about ⅕th of the current in the triggered Josephson junction. The unwanted currents in the next-nearest, second nearest, out to about the fifth or the sixth nearest neighbors, while reducing with distance, may still be significant. Advantageously, the high impedance presented by the example trap circuits described herein greatly attenuates the interference to the Josephson junctions of nearby gates, essentially eliminating the performance degradations that un-attenuated pulses cause.

FIG. 1 is a diagram of a superconducting integrated circuit 100 including trap circuits in accordance with one example. Superconducting integrated circuit 100 may include a clock line 102 coupled to the Clock I terminal, a clock line 104 coupled to the Clock Q terminal, a clock line 106 coupled to the Clock −I terminal, and a clock line 108 coupled to the Clock −Q terminal. Superconducting integrated circuit 100 may further include a bias capacitor 121 coupled between node N1 and clock line 102, a bias capacitor 131 coupled between node N3 and clock line 104, a bias capacitor 141 coupled between node N5 and clock line 106, a bias capacitor 151 coupled between node N7 and clock line 108, a bias capacitor 161 coupled between node N9 and clock line 102, a bias capacitor 171 coupled between node N11 and clock line 104, a bias capacitor 181 coupled between node N13 and clock line 106, and a bias capacitor 191 coupled between node N15 and clock line 108.

With continued reference to FIG. 1, superconducting integrated circuit 100 may include an inductor 124 coupled between a DATA terminal and a node N2. A Josephson junction 122 may also be coupled between node N2 and a ground terminal. Another inductor 126 may be coupled to node N2 to allow coupling with other components of superconducting integrated circuit 100. A trap circuit 120 may be coupled between node N1 and node N2. Trap circuit 120 may include a trap capacitor 123 coupled in parallel with a trap inductor 125. Superconducting integrated circuit 100 may further include an inductor 134 coupled to node N4. A Josephson junction 132 may also be coupled between node N4 and the ground terminal. Another inductor 136 may be coupled to node N4 to allow coupling with other components of superconducting integrated circuit 100. A trap circuit 130 may be coupled between node N3 and node N4. Trap circuit 130 may include a trap capacitor 133 coupled in parallel with a trap inductor 135. Superconducting integrated circuit 100 may further include an inductor 144 coupled to node N6. A Josephson junction 142 may also be coupled between node N6 and the ground terminal. Another inductor 146 may be coupled to node N6 to allow coupling with other components of superconducting integrated circuit 100. A trap circuit 140 may be coupled between node N5 and node N6. Trap circuit 140 may include a trap capacitor 143 coupled in parallel with a trap inductor 145. Superconducting integrated circuit 100 may further include an inductor 154 coupled to node N8. A Josephson junction 152 may also be coupled between node N8 and the ground terminal. Another inductor 156 may be coupled to node N8 to allow coupling with other components of superconducting integrated circuit 100. A trap circuit 150 may be coupled between node N7 and node N8. Trap circuit 150 may include a trap capacitor 153 coupled in parallel with a trap inductor 155.

Still referring to FIG. 1, Superconducting integrated circuit 100 may further include an inductor 164 coupled to node N10. A Josephson junction 162 may also be coupled between node N10 and the ground terminal. Another inductor 166 may be coupled to node N10 to allow coupling with other components of superconducting integrated circuit 100. A trap circuit 160 may be coupled between node N9 and node N10. Trap circuit 160 may include a trap capacitor 163 coupled in parallel with a trap inductor 165. Superconducting integrated circuit 100 may further include an inductor 174 coupled to node N12. A Josephson junction 172 may also be coupled between node N12 and the ground terminal. Another inductor 176 may be coupled to node N12 to allow coupling with other components of superconducting integrated circuit 100. A trap circuit 170 may be coupled between node N11 and node N12. Trap circuit 170 may include a trap capacitor 173 coupled in parallel with a trap inductor 175. Superconducting integrated circuit 100 may further include an inductor 184 coupled to node N14. A Josephson junction 182 may also be coupled between node N14 and the ground terminal. Another inductor 186 may be coupled to node N14 to allow coupling with other components of superconducting integrated circuit 100. A trap circuit 180 may be coupled between node N13 and node N14. Trap circuit 180 may include a trap capacitor 183 coupled in parallel with a trap inductor 185. Superconducting integrated circuit 100 may further include an inductor 194 coupled to node N16. A Josephson junction 192 may also be coupled between node N16 and the ground terminal. Another inductor 196 may be coupled to node N16 to allow coupling with other components of superconducting integrated circuit 100. A trap circuit 190 may be coupled between node N15 and node N16. Trap circuit 190 may include a trap capacitor 193 coupled in parallel with a trap inductor 195.

In one example, clock and power to Josephson junctions and other circuit components may be provided by a harmonic radio frequency signal that may have a frequency in a range between 100 MHz to 100 GHz. Resonant clock networks (RCNs) may be used to distribute clock signals that provide both power and clock to the circuit elements. A clock network may deliver the clock signal to several taps distributed throughout a superconducting integrated circuit. The clock signal delivered at each tap may need to be substantially equal in amplitude and refer to a common phase with a high degree of precision. Such RCNs may advantageously use lower power by using metamaterial transmission lines (MTLs) as the clock structures. An exemplary MTL may be formed using a chain of identical unit cells. Each unit cell may be a passive microwave circuit having one or two inductive stubs, forming clock-lines, along a spine. Each stub may be formed using a short-circuited transmission line (e.g., a microstrip) that is approximately $\lambda/4$ long and provides shunt inductance. The clock structure (e.g., the MTL) may support zero-order resonance (ZOR) at a finite frequency, whose wavelength may be infinite along the direction of the spine, but finite along the direction of the stubs. The clock structure may be designed to resonate at the clock frequency, e.g., the clock frequency that the superconducting circuits need clocking at.

Although FIG. 1 shows a certain number of components of superconducting integrated circuit 100 arranged in a certain manner, there could be more or fewer number of components arranged differently. As an example, although FIG. 1 shows a schematic including certain specific circuits, superconducting integrated circuit 100 may include other type of circuits, such as a logic gate, a flip-flop, or a memory circuit. In addition, although FIG. 1 shows a phase separation of 90 degrees between the clock signals and four clock lines, a phase separation of 120 degrees between the clock signals and three clock lines may also be used. Moreover, although FIG. 1 shows certain phase values associated with the clock lines, the clock lines need not receive clock signals with the phase values shown in FIG. 1. As an example, clock line 102 may receive an AC clock signal with a phase of 270 degrees, clock line 104 may receive an AC clock signal with a phase of 0 degrees, clock line 106 may receive an AC clock signal with a phase of 90 degrees, and clock line 108 may receive an AC clock signal with a phase of 180 degrees. Other phase allocations may also be used. In addition, the trap circuits described with respect to FIG. 1 may be used with many types of superconducting logic circuits, including reciprocal quantum logic (RQL) circuits and rapid single flux quantum (RSFQ) circuits.

In terms of the operation of superconducting integrated circuit 100, each clock line may receive a respective clock signal and provide a respective bias current to a respective Josephson junction. In one example, the clock signal may be an AC signal with a specific phase. The AC clock signal with different phases coupled via different capacitors may propagate signals as one or more single flux quantum (SFQ) pulses. The SFQ pulses may be generated in response to a triggering of a respective Josephson junction. In one example, the pulses may generate loop currents that move through superconducting integrated circuit 100 with one cycle of separation. Each trap circuit may be configured to attenuate any signals generated by the triggering of the Josephson junctions. Thus, trap circuit 120 may be configured to attenuate any SFQ pulse that is generated when Josephson junction 122 is triggered. The built-in capacitance and the inductance associated with a Josephson junction resonates in a frequency band referred to as the plasma frequency of the Josephson junction. Trap circuit 120 is tuned such that its parallel resonant frequency is near the frequency (e.g., the plasma frequency of the Josephson junction) at which Josephson junction 122 rings when it triggers to generate a single flux quantum (SFQ) pulse. In one example, the parallel resonant frequency of trap circuit 120 may be in a range between 0.8 times the plasma frequency to 1.2 times the plasma frequency. Thus tuned, the LC trap presents a high impedance for the frequencies of the SFQ pulse and any pulses that are generated as a result of the ringing of Josephson junction 122. This high impedance greatly attenuates the interference to the Josephson junctions of nearby gates, essentially eliminating the performance degradations that un-attenuated pulses cause. Each of the other trap circuits (trap circuits 130, 140, 150, 160, 170, 180, and 190) operate in a similar manner to reduce the crosstalk among Josephson junctions because of the attenuation of the SFQ pulses and any other unwanted signals generated because of the ringing of the Josephson junctions.

Figure 2:
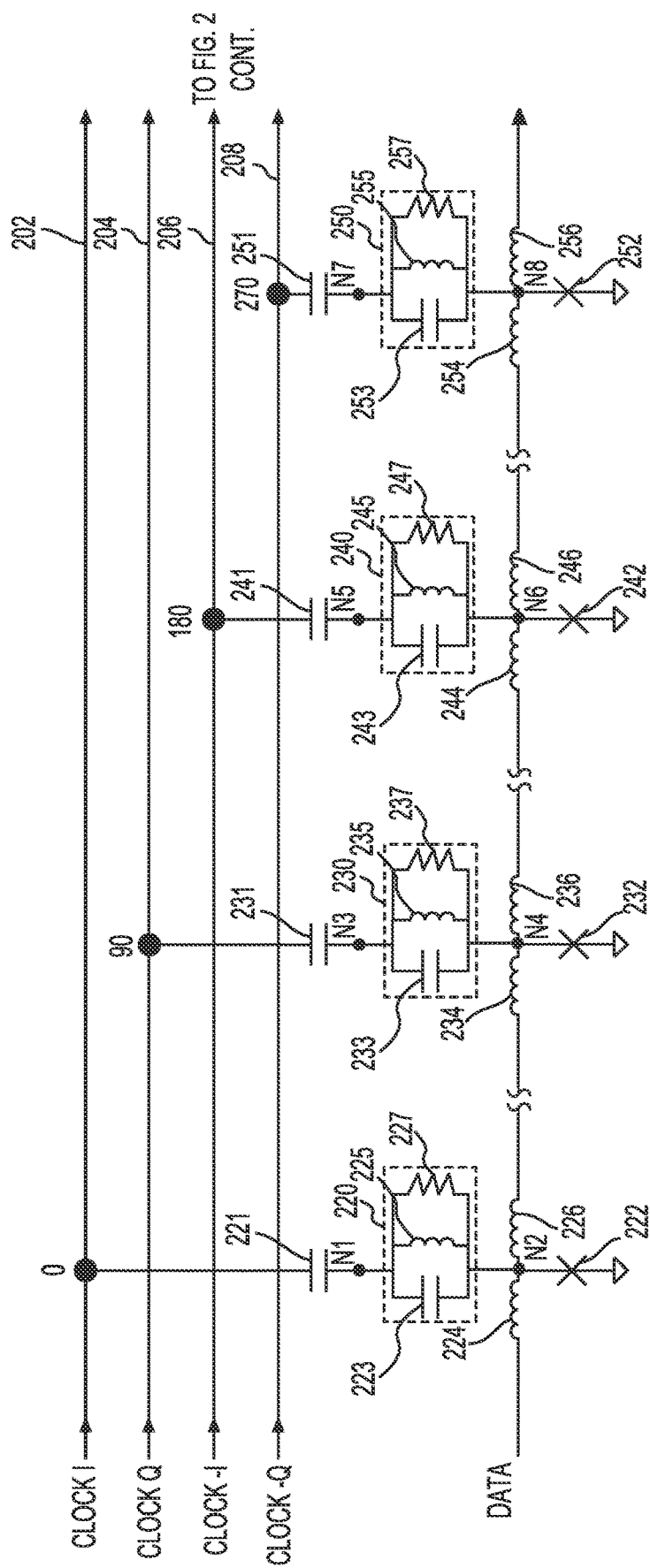
FIG. 2 is a diagram of a superconducting integrated circuit including trap circuits in accordance with another example.
Figure 2:
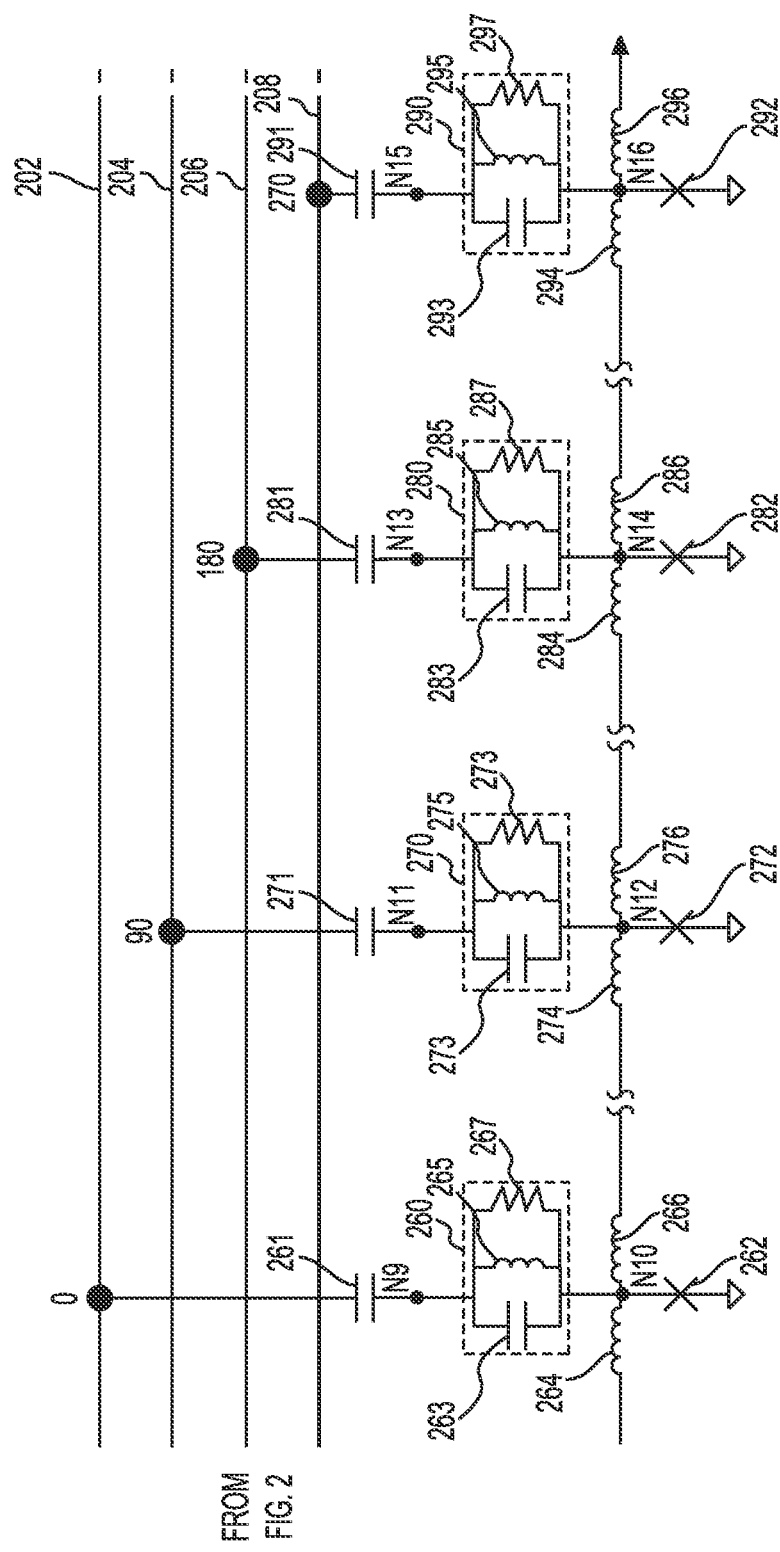

FIG. 2 is a diagram of a superconducting integrated circuit 200 including trap circuits in accordance with another example. Superconducting integrated circuit 200 may include a clock line 202 coupled to the Clock I terminal, a clock line 204 coupled to the Clock Q terminal, a clock line 206 coupled to the Clock −I terminal, and a clock line 208 coupled to the Clock −Q terminal. Superconducting integrated circuit 200 may further include a bias capacitor 221 coupled between node N1 and clock line 202, a bias capacitor 231 coupled between node N3 and clock line 204, a bias capacitor 241 coupled between node N5 and clock line 206, a bias capacitor 251 coupled between node N7 and clock line 208, a bias capacitor 261 coupled between node N9 and clock line 202, a bias capacitor 271 coupled between node N11 and clock line 204, a bias capacitor 281 coupled between node N13 and clock line 206, and a bias capacitor 291 coupled between node N15 and clock line 208.

With continued reference to FIG. 2, superconducting integrated circuit 200 may include an inductor 224 coupled between a DATA terminal and a node N2. A Josephson junction 222 may also be coupled between node N2 and a ground terminal. Another inductor 226 may be coupled to node N2 to allow coupling with other components of superconducting integrated circuit 200. A trap circuit 220 may be coupled between node N2 and node N1. Trap circuit 220 may include a trap capacitor 223 coupled in parallel with a trap inductor 225 and a damping resistor 227. Superconducting integrated circuit 200 may further include an inductor 234 coupled to node N4. A Josephson junction 232 may also be coupled between node N4 and the ground terminal. Another inductor 236 may be coupled to node N4 to allow coupling with other components of superconducting integrated circuit 200. A trap circuit 230 may be coupled between node N4 and node N3. Trap circuit 230 may include a trap capacitor 233 coupled in parallel with a trap inductor 235 and a damping resistor 237. Superconducting integrated circuit 200 may further include an inductor 244 coupled to node N6. A Josephson junction 242 may also be coupled between node N6 and the ground terminal. Another inductor 246 may be coupled to node N6 to allow coupling with other components of superconducting integrated circuit 200. A trap circuit 240 may be coupled between node N6 and node N5. Trap circuit 240 may include a trap capacitor 243 coupled in parallel with a trap inductor 245 and a damping resistor 247. Superconducting integrated circuit 200 may further include an inductor 254 coupled to node N8. A Josephson junction 252 may also be coupled between node N8 and the ground terminal. Another inductor 256 may be coupled to node N8 to allow coupling with other components of superconducting integrated circuit 200. A trap circuit 250 may be coupled between node N8 and node N7. Trap circuit 250 may include a trap capacitor 253 coupled in parallel with a trap inductor 255 and a damping resistor 257.

Still referring to FIG. 2, superconducting integrated circuit 200 may further include an inductor 264 coupled to node N10. A Josephson junction 262 may also be coupled between node N10 and the ground terminal. Another inductor 266 may be coupled to node N10 to allow coupling with other components of superconducting integrated circuit 200. A trap circuit 260 may be coupled between node N10 and node N9. Trap circuit 260 may include a trap capacitor 263 coupled in parallel with a trap inductor 265 and a damping resistor 267. Superconducting integrated circuit 200 may further include an inductor 274 coupled to node N12. A Josephson junction 272 may also be coupled between node N12 and the ground terminal. Another inductor 276 may be coupled to node N12 to allow coupling with other components of superconducting integrated circuit 200. A trap circuit 270 may be coupled between node N12 and node N11. Trap circuit 270 may include a trap capacitor 273 coupled in parallel with a trap inductor 275 and a damping resistor 277. Superconducting integrated circuit 200 may further include an inductor 284 coupled to node N14. A Josephson junction 282 may also be coupled between node N14 and the ground terminal. Another inductor 286 may be coupled to node N14 to allow coupling with other components of superconducting integrated circuit 200. A trap circuit 280 may be coupled between node N14 and node N13. Trap circuit 280 may include a trap capacitor 283 coupled in parallel with a trap inductor 285 and a damping resistor 287. Superconducting integrated circuit 200 may further include an inductor 294 coupled to node N16. A Josephson junction 292 may also be coupled between node N16 and the ground terminal. Another inductor 296 may be coupled to node N16 to allow coupling with other components of superconducting integrated circuit 200. A trap circuit 290 may be coupled between node N16 and node N15. Trap circuit 290 may include a trap capacitor 293 coupled in parallel with a trap inductor 295.

In one example, similar to superconducting integrated circuit 100, clock and power to Josephson junctions and other circuit components of superconducting integrated circuit 200 may be provided by a harmonic radio frequency signal that may have a frequency in a range between 100 MHz to 100 GHz. Resonant clock networks (RCNs) may be used to distribute clock signals that provide both power and clock to the circuit elements. A clock network may deliver the clock signal to several taps distributed throughout a superconducting integrated circuit. The clock signal delivered at each tap may need to be substantially equal in amplitude and refer to a common phase with a high degree of precision. Such RCNs may advantageously use lower power by using metamaterial transmission lines (MTLs) as the clock structures. An exemplary MTL may be formed using a chain of identical unit cells. Each unit cell may be a passive microwave circuit having one or two inductive stubs, forming clock-lines, along a spine. Each stub may be formed using a short-circuited transmission line (e.g., a microstrip) that is approximately $\lambda/4$ long and provides shunt inductance. The clock structure (e.g., the MTL) may support zero-order resonance (ZOR) at a finite frequency, whose wavelength may be infinite along the direction of the spine, but finite along the direction of the stubs. The clock structure may be designed to resonate at the clock frequency, e.g., the clock frequency that the superconducting circuits need clocking at.

Although FIG. 2 shows a certain number of components of superconducting integrated circuit 200 arranged in a certain manner, there could be more or fewer number of components arranged differently. As an example, although FIG. 2 shows a schematic including certain specific circuits, superconducting integrated circuit 200 may include other type of circuits, such as a logic gate, a flip-flop, or a memory circuit. In addition, although FIG. 2 shows a phase separation of 90 degrees between the clock signals and four clock lines, a phase separation of 120 degrees between the clock signals and three clock lines may also be used. Moreover, although FIG. 2 shows certain phase values associated with the clock lines, the clock lines need not receive clock signals with the phase values shown in FIG. 2. As an example, clock line 202 may receive an AC clock signal with a phase of 270 degrees, clock line 204 may receive an AC clock signal with a phase of 0 degrees, clock line 206 may receive an AC clock signal with a phase of 90 degrees, and clock line 208 may receive an AC clock signal with a phase of 180 degrees. Other phase allocations may also be used. In addition, the trap circuits described with respect to FIG. 2 may be used with many types of superconducting logic circuits, including reciprocal quantum logic (RQL) circuits and rapid single flux quantum (RSFQ) circuits.

In terms of the operation of superconducting integrated circuit 200, each clock line may receive a respective clock signal and provide a respective bias current to a respective Josephson junction. In one example, the clock signal may be an AC signal with a specific phase. The AC clock signal with different phases coupled via different capacitors may propagate signals as one or more single flux quantum (SFQ) pulses. The SFQ pulses may be generated in response to a triggering of a respective Josephson junction. In one example, the pulses may generate loop currents that move through superconducting integrated circuit 200 with one cycle of separation. Each trap circuit may be configured to attenuate any signals generated by the triggering of the Josephson junctions. As an example, trap circuit 220 may be configured to attenuate any SFQ pulse that is generated when Josephson junction 222 is triggered. The built-in capacitance and the inductance associated with a Josephson junction resonates in a frequency band referred to as the plasma frequency of the Josephson junction. Trap circuit 220 is tuned such that its parallel resonant frequency is near the frequency (e.g., the plasma frequency of the Josephson junction) at which a Josephson junction 222 rings when it triggers to generate a single flux quantum (SFQ) pulse. In one example, the parallel resonant frequency of trap circuit 120 may be in a range between 0.8 times the plasma frequency to 1.2 times the plasma frequency. Thus tuned, the LC trap presents a high impedance for the frequencies of the SFQ pulse and any pulses that are generated as a result of the ringing of Josephson junction 222. This high impedance greatly attenuates the interference to the Josephson junctions of nearby gates, essentially eliminating the performance degradations that un-attenuated pulses cause. Each of the other trap circuits (trap circuits 230, 240, 250, 260, 270, 280, and 290) operate in a similar manner to reduce the crosstalk among Josephson junctions because of the attenuation of the SFQ pulses and any other unwanted signals generated because of the ringing of the Josephson junctions.

In addition, each trap circuit may include a damping resistor (e.g., damping resistors 227, 237, 247, 257, 267, 277, 287, and 297). The damping resistors may increase the bandwidth of the high-impedance frequency range of the trap circuits. Even though the inclusion of the damping resistors may reduce the attenuation caused by the trap circuits, the increase in the bandwidth may reduce crosstalk among Josephson junctions across a wider range of frequencies. The resistance values of the damping resistors may be selected to achieve a desired Q factor.

Figure 3:
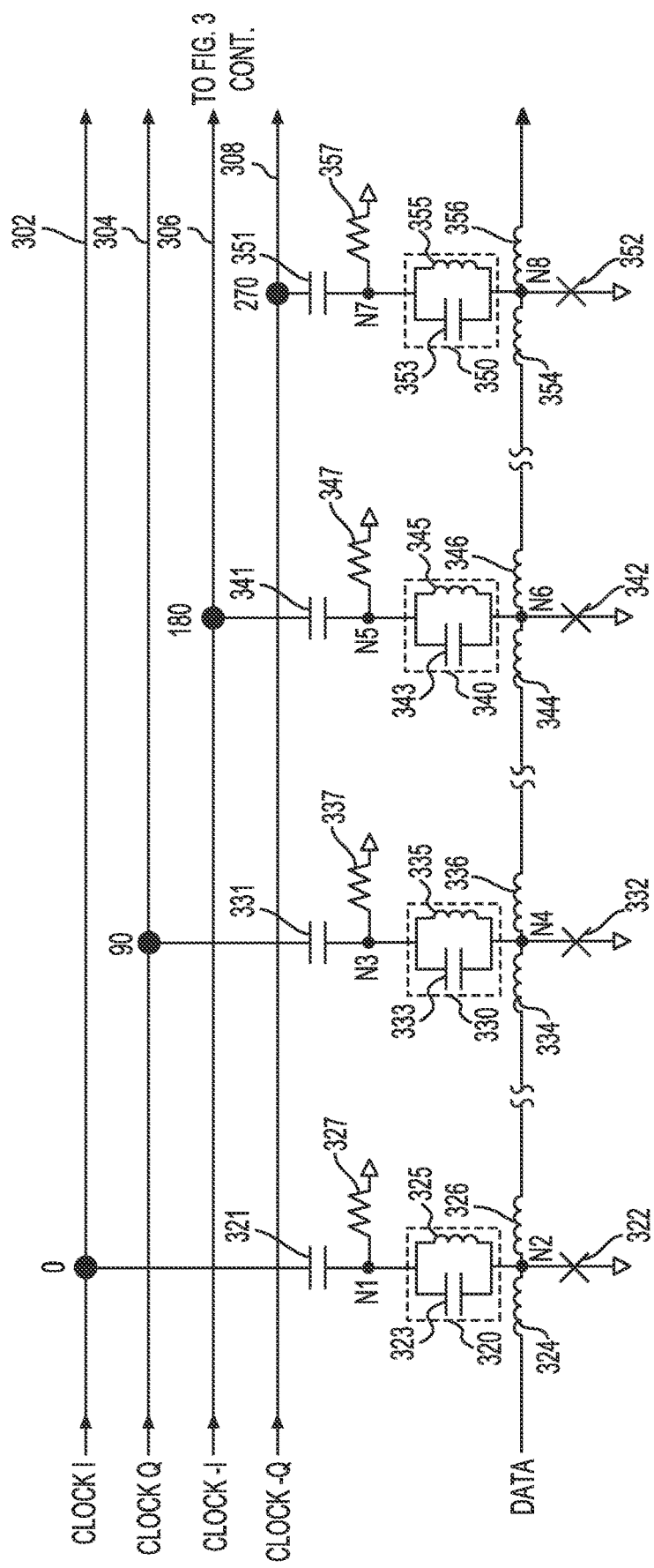
FIG. 3 is a diagram of a superconducting integrated circuit including trap circuits in accordance with another example.
Figure 3:
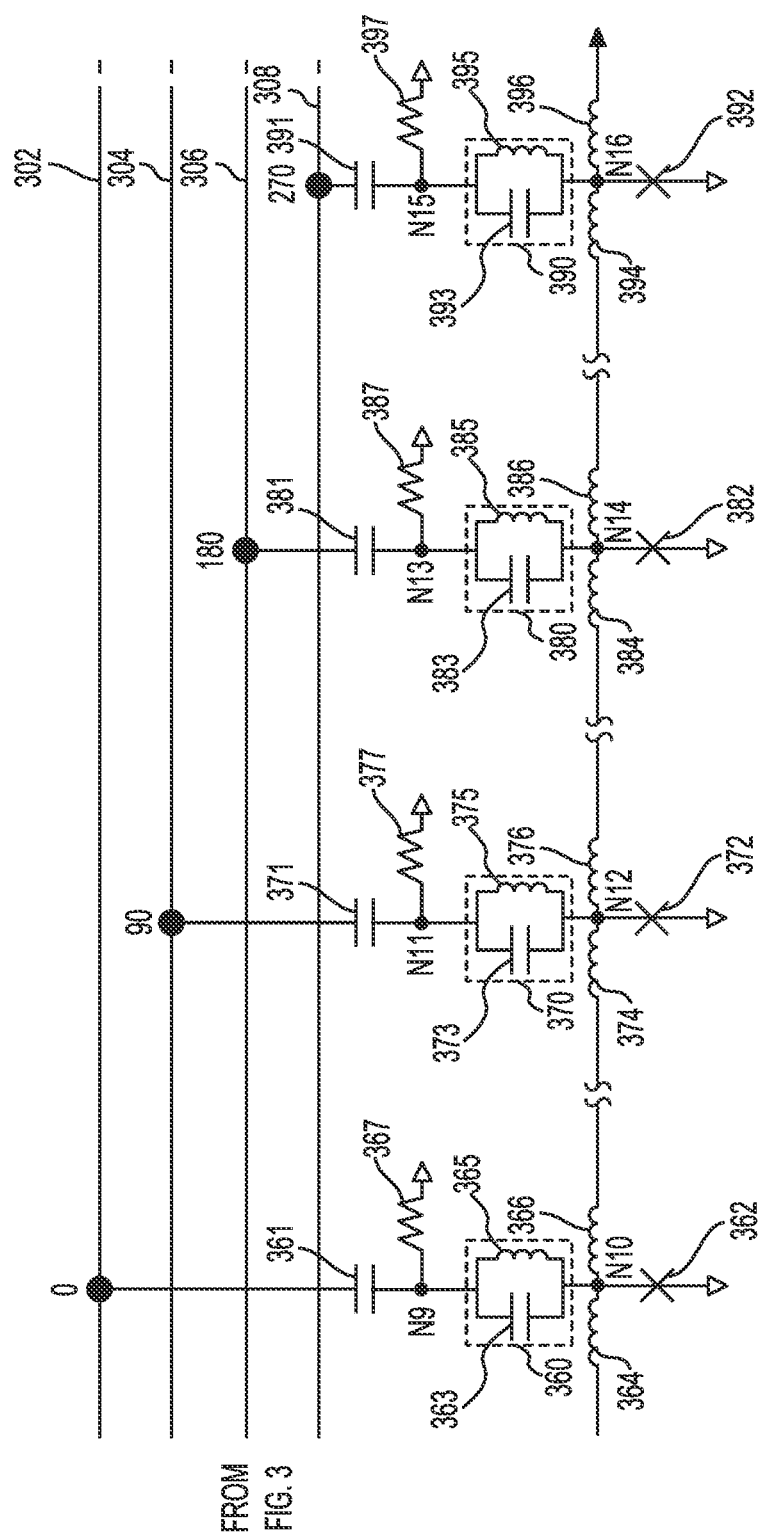

FIG. 3 is a diagram of a superconducting integrated circuit 300 including trap circuits in accordance with one example. Superconducting integrated circuit 300 may include a clock line 302 coupled to the Clock I terminal, a clock line 304 coupled to the Clock Q terminal, a clock line 306 coupled to the Clock –I terminal, and a clock line 308 coupled to the Clock –Q terminal. Superconducting integrated circuit 300 may further include a bias capacitor 321 coupled between node N1 and clock line 302, a bias capacitor 331 coupled between node N4 and clock line 304, a bias capacitor 341 coupled between node N7 and clock line 306, a bias capacitor 351 coupled between node N10 and clock line 308, a bias capacitor 361 coupled between node N13 and clock line 302, a bias capacitor 371 coupled between node N16 and clock line 304, a bias capacitor 381 coupled between node N119 and clock line 306, and a bias capacitor 391 coupled between node N22 and clock line 308.

With continued reference to FIG. 3, superconducting integrated circuit 300 may include an inductor 324 coupled between a DATA terminal and a node N2. A Josephson junction 322 may also be coupled between node N2 and a ground terminal. Another inductor 326 may be coupled to node N2 to allow coupling with other components of superconducting integrated circuit 300. A trap circuit 320 may be coupled between node N2 and node N1. Trap circuit 320 may include a trap capacitor 323 coupled in parallel with a trap inductor 325. A damping resistor 327 may be coupled between node N1 and the ground terminal. Superconducting integrated circuit 300 may further include an inductor 334 coupled to node N4. A Josephson junction 332 may also be coupled between node N4 and the ground terminal. Another inductor 336 may be coupled to node N4 to allow coupling with other components of superconducting integrated circuit 300. A trap circuit 330 may be coupled between node N3 and node N4. Trap circuit 330 may include a trap capacitor 333 coupled in parallel with a trap inductor 335. A damping resistor 337 may be coupled between node N3 and the ground terminal. Superconducting integrated circuit 300 may further include an inductor 344 coupled to node N6. A Josephson junction 342 may also be coupled between node N6 and the ground terminal. Another inductor 346 may be coupled to node N6 to allow coupling with other components of superconducting integrated circuit 300. A trap circuit 340 may be coupled between node N5 and node N6. Trap circuit 340 may include a trap capacitor 343 coupled in parallel with a trap inductor 345. A damping resistor 347 may be coupled between node N5 and the ground terminal. Superconducting integrated circuit 300 may further include an inductor 354 coupled to node N8. A Josephson junction 352 may also be coupled between node N8 and the ground terminal. Another inductor 356 may be coupled to node N8 to allow coupling with other components of superconducting integrated circuit 300. A trap circuit 350 may be coupled between node N7 and node N8. Trap circuit 350 may include a trap capacitor 353 coupled in parallel with a trap inductor 355. A damping resistor 357 may be coupled between node N7 and the ground terminal.

Still referring to FIG. 3, superconducting integrated circuit 300 may further include an inductor 364 coupled to node N10. A Josephson junction 362 may also be coupled between node N10 and the ground terminal. Another inductor 366 may be coupled to node N10 to allow coupling with other components of superconducting integrated circuit 300. A trap circuit 360 may be coupled between node N9 and node N10. Trap circuit 360 may include a trap capacitor 363 coupled in parallel with a trap inductor 365. A damping resistor 367 may be coupled between node N9 and the ground terminal. Superconducting integrated circuit 300 may further include an inductor 374 coupled to node N12. A Josephson junction 372 may also be coupled between node N12 and the ground terminal. Another inductor 376 may be coupled to node N12 to allow coupling with other components of superconducting integrated circuit 300. A trap circuit 370 may be coupled between node N11 and node N12. Trap circuit 370 may include a trap capacitor 373 coupled in parallel with a trap inductor 375. A damping resistor 377 may be coupled between node N11 and the ground terminal. Superconducting integrated circuit 300 may further include an inductor 384 coupled to node N14. A Josephson junction 382 may also be coupled between node N14 and the ground terminal. Another inductor 386 may be coupled to node N14 to allow coupling with other components of superconducting integrated circuit 300. A trap circuit 380 may be coupled between node N13 and node N14. Trap circuit 380 may include a trap capacitor 383 coupled in parallel with a trap inductor 385. A damping resistor 387 may be coupled between node N13 and the ground terminal. Superconducting integrated circuit 300 may further include an inductor 394 coupled to node N16. A Josephson junction 392 may also be coupled between node N16 and the ground terminal. Another inductor 396 may be coupled to node N16 to allow coupling with other components of superconducting integrated circuit 300. A trap circuit 390 may be coupled between node N15 and node N16. Trap circuit 390 may include a trap capacitor 393 coupled in parallel with a trap inductor 395. A damping resistor 397 may be coupled between node N15 and the ground terminal.

In one example, similar to superconducting integrated circuit 100, clock and power to Josephson junctions and other circuit components of superconducting integrated circuit 300 may be provided by a harmonic radio frequency signal that may have a frequency in a range between 100 MHz to 100 GHz. Resonant clock networks (RCNs) may be used to distribute clock signals that provide both power and clock to the circuit elements. A clock network may deliver the clock signal to several taps distributed throughout a superconducting integrated circuit. The clock signal delivered at each tap may need to be substantially equal in amplitude and refer to a common phase with a high degree of precision. Such RCNs may advantageously use lower power by using metamaterial transmission lines (MTLs) as the clock structures. An exemplary MTL may be formed using a chain of identical unit cells. Each unit cell may be a passive microwave circuit having one or two inductive stubs, forming clock-lines, along a spine. Each stub may be formed using a short-circuited transmission line (e.g., a microstrip) that is approximately $\lambda/4$ long and provides shunt inductance. The clock structure (e.g., the MTL) may support zero-order resonance (ZOR) at a finite frequency, whose wavelength may be infinite along the direction of the spine, but finite along the direction of the stubs. The clock structure may be designed to resonate at the clock frequency, e.g., the clock frequency that the superconducting circuits need clocking at.

Although FIG. 3 shows a certain number of components of superconducting integrated circuit 300 arranged in a certain manner, there could be more or fewer number of components arranged differently. As an example, although FIG. 3 shows a schematic including certain specific circuits, superconducting integrated circuit 300 may include other type of circuits, such as a logic gate, a flip-flop, or a memory circuit. In addition, although FIG. 3 shows a phase separation of 90 degrees between the clock signals and four clock lines, a phase separation of 120 degrees between the clock signals and three clock lines may also be used. Moreover, although FIG. 3 shows certain phase values associated with the clock lines, the clock lines need not receive clock signals with the phase values shown in FIG. 3. As an example, clock line 302 may receive an AC clock signal with a phase of 270 degrees, clock line 304 may receive an AC clock signal with a phase of 0 degrees, clock line 306 may receive an AC clock signal with a phase of 90 degrees, and clock line 308 may receive an AC clock signal with a phase of 180 degrees. Other phase allocations may also be used. In addition, the trap circuits described with respect to FIG. 3 may be used with many types of superconducting logic circuits, including reciprocal quantum logic (RQL) circuits and rapid single flux quantum (RSFQ) circuits.

In terms of the operation of superconducting integrated circuit 300, each clock line may receive a respective clock signal and provide a respective bias current to a respective Josephson junction. In one example, the clock signal may be an AC signal with a specific phase. The AC clock signal with different phases coupled via different capacitors may propagate signals as one or more single flux quantum (SFQ) pulses. The SFQ pulses may be generated in response to a triggering of a respective Josephson junction. In one example, the pulses may generate loop currents that move through superconducting integrated circuit 300 with one cycle of separation. Each trap circuit may be configured to attenuate any signals generated by the triggering of the Josephson junctions. As an example, trap circuit 320 may be configured to attenuate any SFQ pulse that is generated when Josephson junction 322 is triggered. The built-in capacitance and the inductance associated with a Josephson junction resonates in a frequency band referred to as the plasma frequency of the Josephson junction. Trap circuit 320 is tuned such that its parallel resonant frequency is near the frequency (e.g., the plasma frequency of the Josephson junction) at which Josephson junction 322 rings when it triggers to generate a single flux quantum (SFQ) pulse. In one example, the parallel resonant frequency of trap circuit 120 may be in a range between 0.8 times the plasma frequency to 1.2 times the plasma frequency. Thus tuned, the LC trap presents a high impedance for the frequencies of the SFQ pulse and any pulses that are generated as a result of the ringing of Josephson junction 322. This high impedance may greatly attenuate the interference to the Josephson junctions of nearby gates, essentially eliminating the performance degradations that un-attenuated pulses cause. Each of the other trap circuits (trap circuits 330, 340, 350, 360, 370, 380, and 390) operate in a similar manner to reduce the crosstalk among Josephson junctions because of the attenuation of the SFQ pulses and any other unwanted signals generated because of the ringing of the Josephson junctions.

In addition, as described earlier with respect to FIG. 3, a damping resistor may be coupled between the ground terminal and a respective Josephson junction. The damping resistors may increase the bandwidth of the high-impedance frequency range of the trap circuits. Even though the inclusion of the damping resistors may reduce the attenuation caused by the trap circuits, the increase in the bandwidth may reduce crosstalk among Josephson junctions across a wider range of frequencies. The resistance values of the damping resistors may be selected to achieve a desired Q factor.

Figure 4:
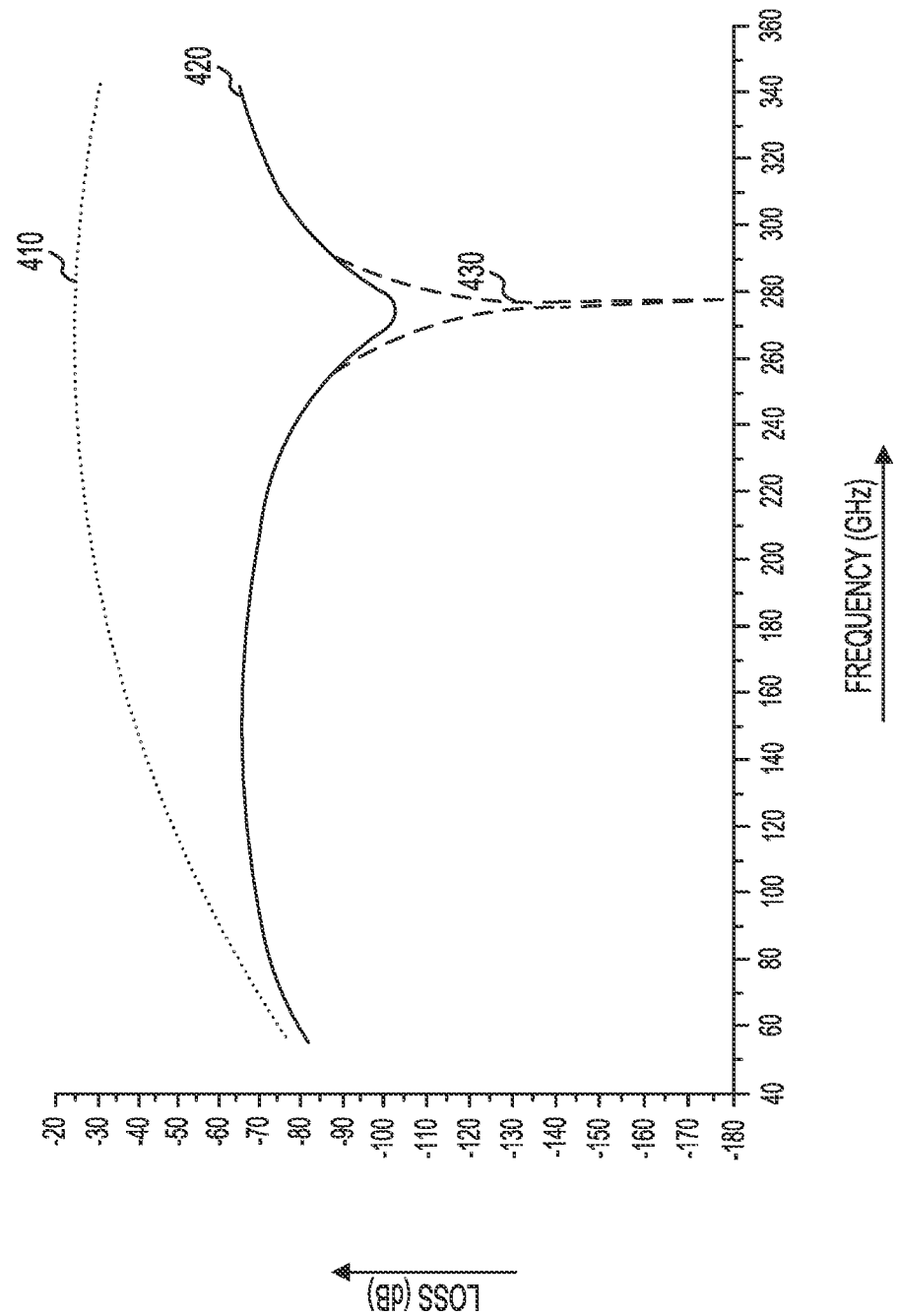
FIG. 4 is a graph showing the relative differences in the loss in the absence or the presence of the example trap circuits in a superconducting integrated circuit.

FIG. 4 is a graph 400 showing the relative differences in the loss in the absence or the presence of the example trap circuits in a superconducting integrated circuit. Graph 400 shows the loss (dB) along the vertical axis and the frequency (GHz) of the signal being attenuated along the horizontal axis. Curve 410 shows the interference when no trap circuits are present in a superconducting integrated circuit. As shown by curve 410, at a frequency of 280 GHz, the interference is about −25 dB. Curve 420 shows the decreased interference when the trap circuits explained with respect to FIG. 1 are used. As shown by curve 420, at a frequency of 280 GHz, the interference drops to −102 dB. Curve 430 shows the decreased interference when the trap circuits and the damping resistors explained with respect to FIG. 3 are used. As shown by curve 430, at a frequency of 280 GHz, the interference drops sharply, but not as smoothly.

Figure 5:
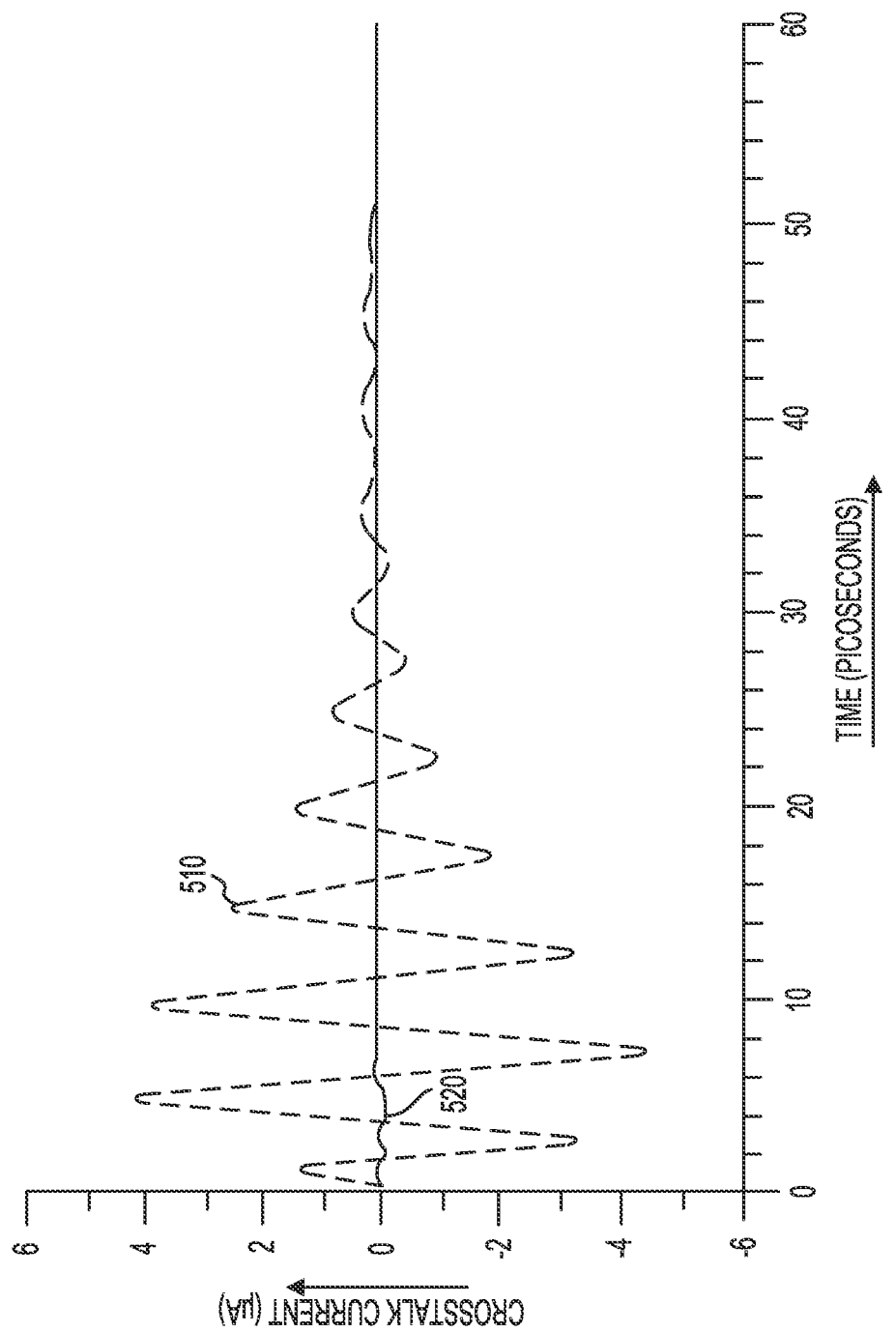
FIG. 5 is a graph showing the reduction in crosstalk in accordance with one example.

FIG. 5 is a graph 500 showing the reduction in crosstalk in accordance with one example. Curve 510 shows the amount of unwanted crosstalk current in a Josephson junction without the use of a trap circuit. Curve 520 shows the reduced crosstalk current in a similar Josephson junction when a trap circuit is used.

Any of the superconducting integrated circuits described herein may be implemented using large scale integrated circuit manufacturing techniques using a process involving niobium metal layers to form the clock lines and the ground plane. To determine the amount of capacitance required for the capacitors for use with an integrated circuit the following equation may be used: $V2\pi fC=I_{JJ}$, where $I_{JJ}$ represents the Josephson junction current, V is the voltage across the capacitor, f is the frequency of the alternating current clock signal, and C is the capacitance of the capacitor. In this example, the impedance (Zc) seen by the clock signal may be represented by the equation: $Zc=1/\{2\pi fC\}$. Advantageously, capacitive coupling allows the use of high-frequency clock signals because the impedance seen by the clock signal is inversely proportional to the frequency of the clock signal. Moreover, advantageously, the use of the trap circuits helps reduce unwanted crosstalk in such capacitively-coupled resonant clock networks.

In conclusion, in one example, the present disclosure relates to a superconducting integrated circuit including a clock structure coupled: (1) to a first Josephson junction via a first capacitor, where the first capacitor is configured to receive a clock signal via the clock structure and couple a first bias current to the first Josephson junction, and (2) to a second Josephson junction via a second capacitor, where the second capacitor is configured to receive a clock signal via the clock structure and couple a second bias current to the second Josephson junction. The superconducting integrated circuit may further include a trap circuit coupled between the first capacitor and the first Josephson junction, where the trap circuit is configured to attenuate any signals generated by a triggering of the first Josephson junction to reduce crosstalk between the first Josephson junction and the second Josephson junction.

The trap circuit may include a trap capacitor coupled in parallel with a trap inductor to form an LC tank. The trap circuit may further include a damping resistor coupled in parallel to the LC tank. Alternatively, or additionally, the damping resistor may be coupled between the first Josephson junction and a ground terminal.

The clock line may correspond to a capacitively-coupled resonant clock network. The clock signal may include an alternating current clock signal configured to supply power to any superconducting circuits coupled to the clock line. The first Josephson junction has a plasma frequency, and the trap circuit may be configured to attenuate at least any signals having a frequency in a range between 0.8 times the plasma frequency to 1.2 times the plasma frequency.

In another aspect, the present disclosure relates to a superconducting integrated circuit including a resonant clock network capacitively-coupled to a first Josephson junction and a second Josephson junction. The superconducting integrated circuit may further include a trap circuit coupled between the first Josephson junction and the resonant clock network, where the trap circuit is configured to attenuate any signals generated by a triggering of the first Josephson junction to reduce crosstalk between the first Josephson junction and the second Josephson junction.

The trap circuit may include a trap capacitor coupled in parallel with a trap inductor to form an LC tank. The trap circuit may further include a damping resistor coupled in parallel to the LC tank. Alternatively, or additionally, the damping resistor may be coupled between the first Josephson junction and a ground terminal.

The resonant clock network may comprise metamaterial transmission lines. The clock signal may comprise an alternating current clock signal configured to supply power to any superconducting circuits coupled to the resonant clock network. The first Josephson junction has a plasma frequency, and the trap circuit may be configured to attenuate at least any signals having a frequency in a range between 0.8 times the plasma frequency to 1.2 times the plasma frequency.

In yet another aspect, the present disclosure relates to a superconducting integrated circuit including a first capacitor for coupling a first Josephson junction to a first node of a first clock line associated with the resonant clock network, where the first clock line is configured to provide a first clock signal having a first phase. The superconducting integrated circuit may further include a second capacitor for coupling a second Josephson junction to a second node of the first clock line. The superconducting integrated circuit may further include a third capacitor for coupling a third Josephson junction to a first node of a second clock line associated with the resonant clock network, where the second clock line is configured to provide a second clock signal having a second phase different from the first phase. The superconducting integrated circuit may further include a fourth capacitor for coupling a fourth Josephson junction to a second node of the second clock line. The superconducting integrated circuit may further include a first trap circuit coupled between the first capacitor and the first Josephson junction, where the first trap circuit is configured to attenuate any signals generated by a triggering of the first Josephson junction to reduce crosstalk between the first Josephson junction and the second Josephson junction. The superconducting integrated circuit may further include a second trap circuit coupled between the third capacitor and the third Josephson junction, where the second trap circuit is configured to attenuate any signals generated by a triggering of the third Josephson junction to reduce crosstalk between the third Josephson junction and the fourth Josephson junction.

The first trap circuit may comprise a first trap capacitor coupled in parallel with a first trap inductor to form a first LC tank, and the second trap circuit may comprise a second trap capacitor coupled in parallel with a second trap inductor to form a second LC tank. The first trap circuit may further comprise a first damping resistor coupled in parallel to the first LC tank, and the second trap circuit may further comprise a second damping resistor coupled in parallel to the second LC tank. The superconducting integrated circuit may further include a first damping resistor coupled between the first Josephson junction and a ground terminal, and a second damping resistor coupled between the third Josephson junction and the ground terminal.

The first clock signal may comprise a first alternating current clock signal configured to supply power to any superconducting circuits coupled to the first clock line, and the second clock signal may comprise a second alternating current clock signal configured to supply power to any superconducting circuits coupled to the second clock line. The first Josephson junction has a first plasma frequency, and the first trap circuit is configured to attenuate at least any signals having a first frequency in a range between 0.8 times the first plasma frequency to 1.2 times the first plasma frequency. The third Josephson junction has a second plasma frequency, and the second trap circuit is configured to attenuate at least any signals having a second frequency in a range between 0.8 times the second plasma frequency to 1.2 times the second plasma frequency.

It is to be understood that the methods, modules, devices, systems, and components depicted herein are merely exemplary. Alternatively, or in addition, the functionally described herein can be performed, at least in part, by one or more hardware logic components. For example, and without limitation, illustrative types of hardware logic components that can be used include Field-Programmable Gate Arrays (FPGAs), Application-Specific Integrated Circuits (ASICs), Application-Specific Standard Products (ASSPs), System-on-a-Chip systems (SOCs), Complex Programmable Logic Devices (CPLDs), etc. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or inter-medial components. Likewise, any two components so associated can also be viewed as being "operably connected," or "coupled," to each other to achieve the desired functionality.

The functionality associated with the examples described in this disclosure can also include instructions stored in a non-transitory media. The term "non-transitory media" as used herein refers to any media storing data and/or instructions that cause a machine to operate in a specific manner. Exemplary non-transitory media include non-volatile media and/or volatile media. Non-volatile media include, for example, a hard disk, a solid state drive, a magnetic disk or tape, an optical disk or tape, a flash memory, an EPROM, NVRAM, PRAM, or other such media, or networked versions of such media. Volatile media include, for example, dynamic memory, such as, DRAM, SRAM, a cache, or other such media. Non-transitory media is distinct from, but can be used in conjunction with transmission media. Transmission media is used for transferring data and/or instruction to or from a machine. Exemplary transmission media include coaxial cables, fiber-optic cables, copper wires, and wireless media, such as radio waves.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the disclosure provides specific examples, various modifications and changes can be made without departing from the scope of the disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to a specific example are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed:

1. A superconducting integrated circuit comprising:
   a first capacitor for coupling a first Josephson junction to a first node of a first clock line associated with a resonant clock network, wherein the first clock line is configured to provide a first clock signal having a first phase;
   a second capacitor for coupling a second Josephson junction to a second node of the first clock line;
   a third capacitor for coupling a third Josephson junction to a first node of a second clock line associated with the resonant clock network, wherein the second clock line is configured to provide a second clock signal having a second phase different from the first phase;
   a fourth capacitor for coupling a fourth Josephson junction to a second node of the second clock line;
   a first trap circuit coupled between the first capacitor and the first Josephson junction, wherein the first trap circuit is configured to attenuate any signals generated by a triggering of the first Josephson junction to reduce crosstalk between the first Josephson junction and the second Josephson junction; and
   a second trap circuit coupled between the third capacitor and the third Josephson junction, wherein the second trap circuit is configured to attenuate any signals generated by a triggering of the third Josephson junction to reduce crosstalk between the third Josephson junction and the fourth Josephson junction.

2. The superconducting integrated circuit of claim 1, wherein the first trap circuit comprises a first trap capacitor coupled in parallel with a first trap inductor to form a first LC tank, and wherein the second trap circuit comprises a second trap capacitor coupled in parallel with a second trap inductor to form a second LC tank.

3. The superconducting integrated circuit of claim 2, wherein the first trap circuit further comprises a first damping resistor coupled in parallel to the first LC tank, and wherein the second trap circuit further comprises a second damping resistor coupled in parallel to the second LC tank.

4. The superconducting integrated circuit of claim 1, further comprising a first damping resistor coupled to a first node between the first trap circuit and a ground terminal, and a second damping resistor coupled to a second node between the second trap circuit and the ground terminal.

5. The superconducting integrated circuit of claim 1, wherein the first clock signal comprises a first alternating current clock signal configured to supply power to any superconducting circuits coupled to the first clock line, and wherein the second clock signal comprises a second alternating current clock signal configured to supply power to any superconducting circuits coupled to the second clock line.

6. The superconducting integrated circuit of claim 1, wherein the first Josephson junction has a first plasma frequency, and wherein the first trap circuit is configured to attenuate at least any signals having a first frequency in a range between 0.8 times the first plasma frequency to 1.2 times the first plasma frequency, and wherein the third Josephson junction has a second plasma frequency, and wherein the second trap circuit is configured to attenuate at least any signals having a second frequency in a range between 0.8 times the second plasma frequency to 1.2 times the second plasma frequency.

7. The superconducting integrated circuit of claim 1, wherein each of the signals generated by the triggering of the first Josephson junction comprises a first single flux quantum (SFQ) pulse, and wherein each of the signals generated by the triggering of the third Josephson junction comprises a second SFQ pulse.

8. A superconducting integrated circuit comprising:
a first capacitor for coupling a first Josephson junction to a first node of a first clock line associated with a resonant clock network, wherein the first clock line is configured to provide a first clock signal having a first phase;
a second capacitor for coupling a second Josephson junction to a second node of the first clock line;
a third capacitor for coupling a third Josephson junction to a first node of a second clock line associated with the resonant clock network, wherein the second clock line is configured to provide a second clock signal having a second phase different from the first phase;
a fourth capacitor for coupling a fourth Josephson junction to a second node of the second clock line;
a first trap circuit coupled between the first capacitor and the first Josephson junction, wherein the first trap circuit is configured to attenuate any signals generated by a triggering of the first Josephson junction to reduce crosstalk between the first Josephson junction and the second Josephson junction; and
a second trap circuit coupled between the third capacitor and the third Josephson junction, wherein the second trap circuit is configured to attenuate any signals generated by a triggering of the third Josephson junction to reduce crosstalk between the third Josephson junction and the fourth Josephson junction, and wherein the resonant clock network comprises clock structures formed using metamaterial transmission lines.

9. The superconducting integrated circuit of claim 8, wherein the first trap circuit comprises a first trap capacitor coupled in parallel with a first trap inductor to form a first LC tank, and wherein the second trap circuit comprises a second trap capacitor coupled in parallel with a second trap inductor to form a second LC tank.

10. The superconducting integrated circuit of claim 8, wherein the first trap circuit further comprises a first damping resistor coupled in parallel to the first LC tank, and wherein the second trap circuit further comprises a second damping resistor coupled in parallel to the second LC tank.

11. The superconducting integrated circuit of claim 8, further comprising a first damping resistor coupled to a first node between the first trap circuit and a ground terminal, and a second damping resistor coupled to a second node between the second trap circuit and the ground terminal.

12. The superconducting integrated circuit of claim 8, wherein the first clock signal comprises a first alternating current clock signal configured to supply power to any superconducting circuits coupled to the first clock line, and wherein the second clock signal comprises a second alternating current clock signal configured to supply power to any superconducting circuits coupled to the second clock line.

13. The superconducting integrated circuit of claim 8, wherein the first Josephson junction has a first plasma frequency, and wherein the first trap circuit is configured to attenuate at least any signals having a first frequency in a range between 0.8 times the first plasma frequency to 1.2 times the first plasma frequency, and wherein the third Josephson junction has a second plasma frequency, and wherein the second trap circuit is configured to attenuate at least any signals having a second frequency in a range between 0.8 times the second plasma frequency to 1.2 times the second plasma frequency.

14. The superconducting integrated circuit of claim 8, wherein each of the signals generated by the triggering of the first Josephson junction comprises a first single flux quantum (SFQ) pulse, and wherein each of the signals generated by the triggering of the third Josephson junction comprises a second SFQ pulse.

15. A superconducting integrated circuit comprising:
a first capacitor for coupling a first Josephson junction to a first node of a first clock line associated with a resonant clock network, wherein the first clock line is configured to provide a first clock signal having a first phase;
a second capacitor for coupling a second Josephson junction to a second node of the first clock line;
a third capacitor for coupling a third Josephson junction to a first node of a second clock line associated with the resonant clock network, wherein the second clock line is configured to provide a second clock signal having a second phase different from the first phase;
a fourth capacitor for coupling a fourth Josephson junction to a second node of the second clock line;
a first trap circuit coupled between the first capacitor and the first Josephson junction, wherein the first trap circuit is configured to attenuate any signals generated by a triggering of the first Josephson junction to reduce crosstalk between the first Josephson junction and the second Josephson junction; and a second trap circuit coupled between the third capacitor and the third Josephson junction, wherein the second trap circuit is configured to attenuate any signals generated by a triggering of the third Josephson junction to reduce crosstalk between the third Josephson junction and the fourth Josephson junction, wherein the resonant clock network comprises clock structures formed using metamaterial transmission lines, and wherein each of the clock structures is configured to resonate at a clock frequency associated with the superconducting integrated circuit.

16. The superconducting integrated circuit of claim 15, wherein the first trap circuit comprises a first trap capacitor coupled in parallel with a first trap inductor to form a first LC tank, and wherein the second trap circuit comprises a second trap capacitor coupled in parallel with a second trap inductor to form a second LC tank.

17. The superconducting integrated circuit of claim 15, wherein the first trap circuit further comprises a first damping resistor coupled in parallel to the first LC tank, and wherein the second trap circuit further comprises a second damping resistor coupled in parallel to the second LC tank.

18. The superconducting integrated circuit of claim 15, further comprising a first damping resistor coupled to a first node between the first trap circuit and a ground terminal, and a second damping resistor coupled to a second node between the second trap circuit and the ground terminal.

19. The superconducting integrated circuit of claim 15, wherein the first clock signal comprises a first alternating current clock signal configured to supply power to any superconducting circuits coupled to the first clock line, and wherein the second clock signal comprises a second alternating current clock signal configured to supply power to any superconducting circuits coupled to the second clock line.

20. The superconducting integrated circuit of claim 15, wherein the first Josephson junction has a first plasma frequency, and wherein the first trap circuit is configured to attenuate at least any signals having a first frequency in a range between 0.8 times the first plasma frequency to 1.2 times the first plasma frequency, and wherein the third Josephson junction has a second plasma frequency, and wherein the second trap circuit is configured to attenuate at least any signals having a second frequency in a range between 0.8 times the second plasma frequency to 1.2 times the second plasma frequency.

* * * * *